United States Patent
Thirimanne et al.

(10) Patent No.: US 11,340,362 B2
(45) Date of Patent: May 24, 2022

(54) DIRECT CONVERSION RADIATION DETECTOR

(71) Applicant: Silverray Limited, Herts (GB)

(72) Inventors: Hashini Manodya Thirimanne, Guildford (GB); Koruwakankanange Don Gershon Imalka Jayawardena, Guildford (GB); Sembukuttiarachilage Ravi Pradip Silva, Camberley (GB); Christopher Alan Mills, Guildford (GB)

(73) Assignee: Silverray Limited

( * ) Notice: Subject to any disclaimer, the term of this patent is extended or adjusted under 35 U.S.C. 154(b) by 288 days.

(21) Appl. No.: 16/345,917

(22) PCT Filed: Oct. 26, 2017

(86) PCT No.: PCT/GB2017/053229
§ 371 (c)(1),
(2) Date: Apr. 29, 2019

(87) PCT Pub. No.: WO2018/078372
PCT Pub. Date: May 3, 2018

(65) Prior Publication Data
US 2019/0257959 A1    Aug. 22, 2019

Related U.S. Application Data

(60) Provisional application No. 62/413,452, filed on Oct. 27, 2016.

(51) Int. Cl.
*G01T 1/24*     (2006.01)
*B82Y 30/00*    (2011.01)
*H01L 31/08*    (2006.01)

(52) U.S. Cl.
CPC .............. *G01T 1/241* (2013.01); *B82Y 30/00* (2013.01); *G01T 1/24* (2013.01); *H01L 31/085* (2013.01)

(58) Field of Classification Search
CPC .. G01T 1/241; G01T 1/16; G01T 1/24; G01T 3/08; H01L 51/4246; H01L 51/242; H01L 51/4253; H01L 31/1013
(Continued)

(56) References Cited

U.S. PATENT DOCUMENTS 6,969,861 B2 * 11/2005 Shoji .................... A61B 6/4291
                                                250/363.1
2009/0152664 A1 * 6/2009 Klem ................ H01L 27/14603
                                                257/466
(Continued)

FOREIGN PATENT DOCUMENTS

EP       2599621 A1    6/2013

OTHER PUBLICATIONS

International Preliminary Report on Patentability for International Application No. PCT/GB2017/053229, dated Apr. 30, 2019—7 pages.
(Continued)

*Primary Examiner* — Blake C Riddick
(74) *Attorney, Agent, or Firm* — RatnerPrestia

(57) ABSTRACT

A device includes a network having a first material (e.g. electron donor, hole transporting material, p-type semiconductor) for transporting positive electrical charges and a second material (e.g. electron acceptor, electronic transporting material, n-type semiconductor) for transporting negative electrical charges. The first and second materials are dispersed within the network to form a plurality of electrical junctions. A plurality of nanoparticles are dispersed within the network, wherein the nanoparticles have at least one
(Continued)

dimension larger than twice an exciton Bohr radius for the nanoparticles and at least one dimension less than 100 nm. In use, the nanoparticles convert incoming radiation into free positive and negative electrical charges for transportation by the first and second materials respectively.

38 Claims, 10 Drawing Sheets

(58) Field of Classification Search
USPC .................................................. 250/370.09
See application file for complete search history.

(56) References Cited

U.S. PATENT DOCUMENTS

| | | |
|---|---|---|
| 2009/0179155 A1 | 7/2009 | Weinberg |
| 2011/0095266 A1 | 4/2011 | Hayden et al. |
| 2014/0275928 A1* | 9/2014 | Acquista ................ A61N 1/365 |
| | | 600/382 |
| 2016/0258807 A1* | 9/2016 | Pein .......................... G01J 3/04 |

OTHER PUBLICATIONS

International Search Report and Written Opinion for International Application No. PCT/GB2017/053229, dated Dec. 13, 2017—10 pages.

National Institute of Standards and Technology, http://physics.nist.gov/physrefdata/xcom/html/xcom1.html, 1 page.

Huynh et al., "CdSe Nanocrystal Rods/Poly(3-hexylthiophene) Composite Photovoltaic Devices", Advanced Materials, Wiley—V C H Verlag GmbH & Co. KGAA, DE, vol. 11, No. 11, Jan. 1, 1999—pp. 923-927.

\* cited by examiner

DIRECT CONVERSION RADIATION DETECTOR

CROSS-REFERENCE TO RELATED APPLICATIONS

This patent application is a U.S. National Phase Patent Application of PCT Application No.: PCT/GB2017/053229, filed Oct. 26, 2017, which claims priority to U.S. Provisional Patent Application No. 62/413,452 filed Oct. 27, 2016, each of which is incorporated by reference herein in its entirety.

FIELD

The present invention relates to radiation detection. For example, materials for use in radiation detection and detectors incorporating such materials are described.

BACKGROUND

The widespread use of ionising (e.g. nuclear) radiation for a range of applications, such as in radiation therapy, security screening and industrial applications, has necessitated to the development of appropriate radiation detection techniques. Here both the terms "ionising radiation" and "nuclear radiation" are considered to extend to alpha particles, beta particles, X-rays, gamma rays and so on. Common nuclear radiation detectors comprise semiconductor devices, typically silicon (Si) or germanium (Ge). These solid-state devices detect nuclear or ionising radiation by measuring the number of charge carriers (electrons and holes) generated in the detector volume in response to incident radiation. When high energy radiation photons or particles collide with the active semiconductor material in the detector, it causes ionisation and creates charge carriers. The generated charge carriers are accelerated under the influence of the electric field generated by an applied voltage bias. This leads to an electric current which can be readily collected at the electrodes. The current can be found to be proportional to the radiation dose deposited in the material. Depending on the energy of the photons of incident radiation and the atomic number (Z) of the material, there are three main mechanisms through which matter is widely attributed to interact with the incoming photons, namely the photoelectric effect, Compton scattering and pair production. Detectors can measure the amount of radiation incident, the spatial distribution, the radiation spectrum and other properties.

Solid state inorganic radiation detectors based on silicon are known. Despite the excellent performance of the inorganic detectors, they suffer from major drawbacks due to the crystalline detector materials used, such as manufacturability of curved geometries, brittle active materials, high manufacturing costs and limited detector size. In comparison to their better established inorganic counterparts, organic semiconductors (e.g. semiconducting polymers) present several advantages which make them an attractive candidate for large area, low cost electronics. Inks consisting of these organic semiconductors can be prepared by dissolving conjugated polymers, oligomers and small molecules in common organic solvents. These inks can then be simply coated onto substrates using conventional wet processing techniques, leading to the possibility of large area device production at extremely low cost. Due to their flexible nature, large area organic semiconductor based detector panels can be formed to curved geometries, such as tubes, to place around piping to monitor radioactive fluids for example. Flexible organic dosimeters can also be used for patient dosimeters, for X-ray diagnostics or cancer therapy, for example, by forming large area pixelated detector tubes around parts of a patient's body, such as a limb, to provide localised spatial-resolved dose measurements.

Some features of known high energy radiation detectors include low dark current (leakage current), good rectification behaviour, high charge-carrier mobility and high radiation stopping power. Generally, solid state detectors can be sub-categorized as 'direct' and 'indirect' detectors.

FIG. 1 shows an exemplary indirect radiation detection arrangement based on an organic photodiode, indicated generally by the reference numeral 200. The detection arrangement 200 comprises a scintillator material 202 and a photodiode 204. In an indirect conversion detector, the conversion of ionization radiation to electrical signal occurs in a two-step process. Generally the first step of this process involves the conversion of the incident radiation into visible light by means of a scintillator material 202. The second step then transduces the output of the first detector material (which in the case a scintillator is visible light) to an electrical signal by using a second sensor such as a photodiode (e.g. the photodiode 204) which absorbs the visible light to generate an electrical signal. As a fractional (less than 100%) conversion efficiency results in each stage, the multistage nature of the indirect detector technology results in a low conversion efficiency (multiplication of fractional efficiencies) of incoming radiation to current.

In comparison, a direct detector converts the incident ionizing radiation directly into an electrical signal. As this conversion is a one stage process, this possesses a minimal loss of efficiency with a single optimisation set of parameters.

Previously it has been shown that radiation-induced photocurrent can be achieved using single homogeneous materials such as poly-(triarilamine) (PTAA), poly([9,9-dioctylfluorenyl-2,7-diyl]-co-bithiophene) (F8T2) etc in a metal/semiconducting polymer/metal device architecture in direct radiation detectors. Such materials are active polymer materials, but they are only capable of carrying a single type of charge (electron or hole). The mono-carrier nature of devices incorporating single homogeneous materials (single organic semiconductor systems) reduces the overall signal response that can be achieved. The organic semiconductors typically consist of low atomic number (low Z) carbon and hydrogen constituent atoms, which results in a low stopping power (attenuation) for high energy radiation.

The present invention seeks to address at least some of the problems outlined above.

SUMMARY

In a first aspect, this specification describes a device comprising: a network (e.g. a bulk heterojunction) comprising a first material (e.g. (organic or inorganic) electron donor, hole transporting material, p-type semiconductor) for transporting positive electrical charges and a second material (e.g. (organic or inorganic) electron acceptor, electronic transporting material, n-type semiconductor) for transporting negative electrical charges, the first and second materials being dispersed within the network to form a plurality of electrical junctions; and a plurality of nanoparticles dispersed within the network, wherein said nanoparticles have at least one dimension (e.g. a diameter) larger than twice an exciton Bohr radius for said nanoparticles and at least one dimension (e.g. a diameter) less than 100 nm and wherein, in use, said nanoparticles convert incoming radiation (e.g. directly) into free positive and negative electrical charges for transportation by said first and second materials respectively. The said radiation may comprise one or more of alpha particles, beta particles, neutrons, X-rays and gamma rays. One or more dimensions (e.g. a diameter) and/or material of the nanoparticles may be selected depending on a form of radiation intended to be detected by the device.

The nanoparticles may attenuate the incoming radiation.

The nanoparticles may convert said radiation into positive and negative electrical charges in (single) radiation-nanoparticle interaction events.

The nanoparticles may have at least one dimension (e.g. a diameter) between 20 nm and 100 nm (e.g. between 30 nm and 50 nm).

The nanoparticles may have an atomic number of at least 45.

The nanoparticles may be formed from one or more metal oxides.

The first and second materials may be organic semiconductors.

In a second aspect, this specification describes a radiation detector comprising: a first electrode; a second electrode; and a device as described above with respect to the first aspect.

The radiation detector may include a current measuring device.

The radiation detector may include a voltage source (such as a battery). The voltage source may be provided to apply an electric field across the radiation detector to assist with sweeping the electrons and holes to the respective electrodes. As noted elsewhere in this description, such a voltage source may be omitted in some implementations.

The radiation detector may further comprise a wireless transmitter that enables real time data transmission to a remote computer (for example to enable a record to be maintained of the radiation dose a user of the dosimeter is exposed to over time and/or the generation of a warning mechanism that will inform the user of a potential radiation hazard).

The radiation detector may comprise a display for indicating radiation levels.

In a third aspect, this specification describes a system comprising a plurality of radiation detectors as described above with reference to the second aspect.

At least some of the plurality of radiation detectors may be arranged (e.g. by selecting appropriate nanoparticles) to detect different types of radiation (e.g. neutrons and X-rays) and/or to identify different energies of a particular radiation.

A radiation detector in accordance with the second aspect or radiation detectors of the system in accordance with the third aspect may be integrated either on a rigid backing or a flexible backing (such as on a sheet of plastic or a plaster among others).

In a fourth aspect, this specification describes a method comprising: using a device as described above with reference to the first aspect or a radiation detector as described above with reference to the second aspect or a system described above with reference to the third aspect to convert incoming radiation into free positive and negative electrical charges; and recording a characteristic (e.g. current) generated by the positive and negative electrical charges.

The incoming radiation may be converted into positive and negative electrical charges in (single) radiation-nanoparticle interaction events.

The current may be generated in response to the application of a voltage (from a battery) across the device (or in the absence of an external voltage, due to the built-in potential of the device).

The method may further comprise converting the recorded current into an estimate of a level of radiation. (This may also be used to estimate the energy of the radiation received (not dose), but to identify, say, if there are 50 keV X rays being emitted as done for energy dispersive X-ray spectroscopy)

In a fifth aspect, there are provided computer-readable instructions which, when executed by computing apparatus, cause the computing apparatus to perform any method as described with reference to the fourth aspect.

In a sixth aspect, there is provided an apparatus comprising: at least one processor; and at least one memory including computer program code which, when executed by the at least one processor, causes the apparatus to: use a device as described above with reference to the first aspect or a radiation detector as described above with reference to the second aspect or a system described above with reference to the third aspect to convert incoming radiation into free positive and negative electrical charges; and record a characteristic (e.g. current) generated by the positive and negative electrical charges.

In a seventh aspect, this specification describes an apparatus comprising: means for using a device as described above with reference to the first aspect or a radiation detector as described above with reference to the second aspect or a system described above with reference to the third aspect to convert incoming radiation into free positive and negative electrical charges; and means for recording a characteristic (e.g. current) generated by the positive and negative electrical charges.

In an eighth aspect, this specification describes a method comprising: dissolving semiconductors in one or more organic solvents to form a first material suitable for transporting positive electrical charges and a second material suitable for transporting negative electrical charges; and adding a plurality of nanoparticles to said dissolved polymers to form a matrix, wherein said nanoparticles have at least one dimension larger than twice an exciton Bohr radius for said nanoparticles and at least one dimension less than 100 nm. The said matrix may be applied to a substrate. In use, said nanoparticles may convert incoming radiation into free positive and negative electrical charges for transportation by said first and second materials respectively.

The matrix may be applied to the substrate using one of a number of techniques, such as doctor blading, slot die coating, ink jet printing, gravure printing, spray coating, spin coating, drop casting and 3D printing. (The matrix could be applied by any printing technique, including 3D printing.) Printing techniques are not essential, for example pressing the matrix into pellets or tiles is possible, as is evaporation or sputtering.

In a ninth aspect, there is provided an apparatus comprising: means for dissolving semiconductors in one or more organic solvents to form a first material suitable for transporting positive electrical charges and a second material suitable for transporting negative electrical charges; and means for adding a plurality of nanoparticles to said dissolved polymers to form a matrix, wherein said nanoparticles have at least one dimension larger than twice an exciton Bohr radius for said nanoparticles and at least one dimension less than 100 nm.

BRIEF DESCRIPTION OF THE DRAWINGS

Example embodiments will now be described, by way of non-limiting examples, with reference to the following schematic drawings, in which.

DETAILED DESCRIPTION

Figure 1:
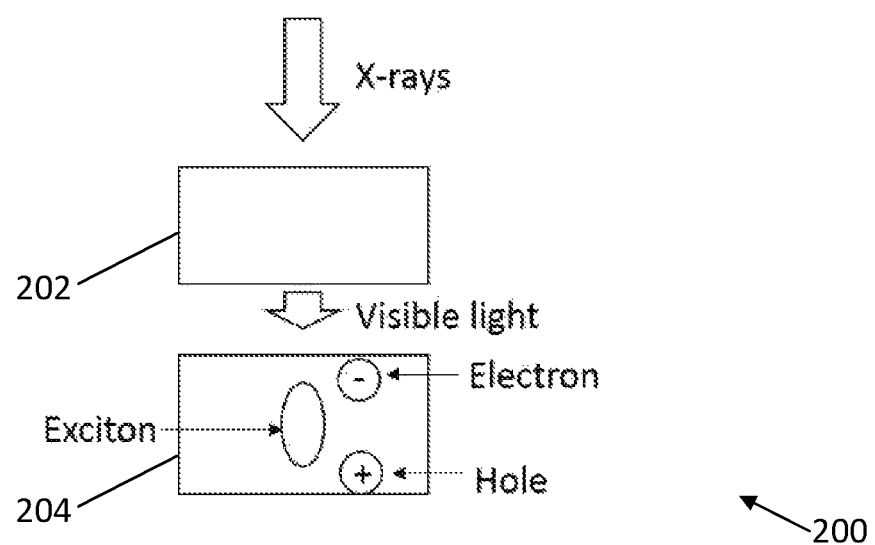
FIG. 1 shows an exemplary indirect radiation detection arrangement.
Figure 2:
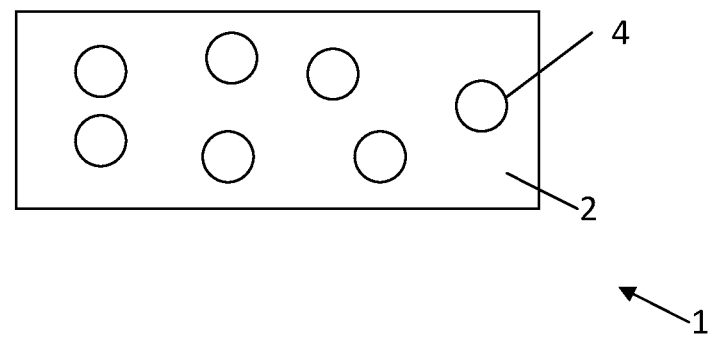
FIG. 2 shows a material in accordance with an exemplary embodiment.

FIG. 2 shows a material, indicated generally by the reference numeral 1, in accordance with an exemplary embodiment. The material 1 includes a bulk material 2 and a plurality of nanoparticles 4 dispersed in the bulk material.

Figure 3:
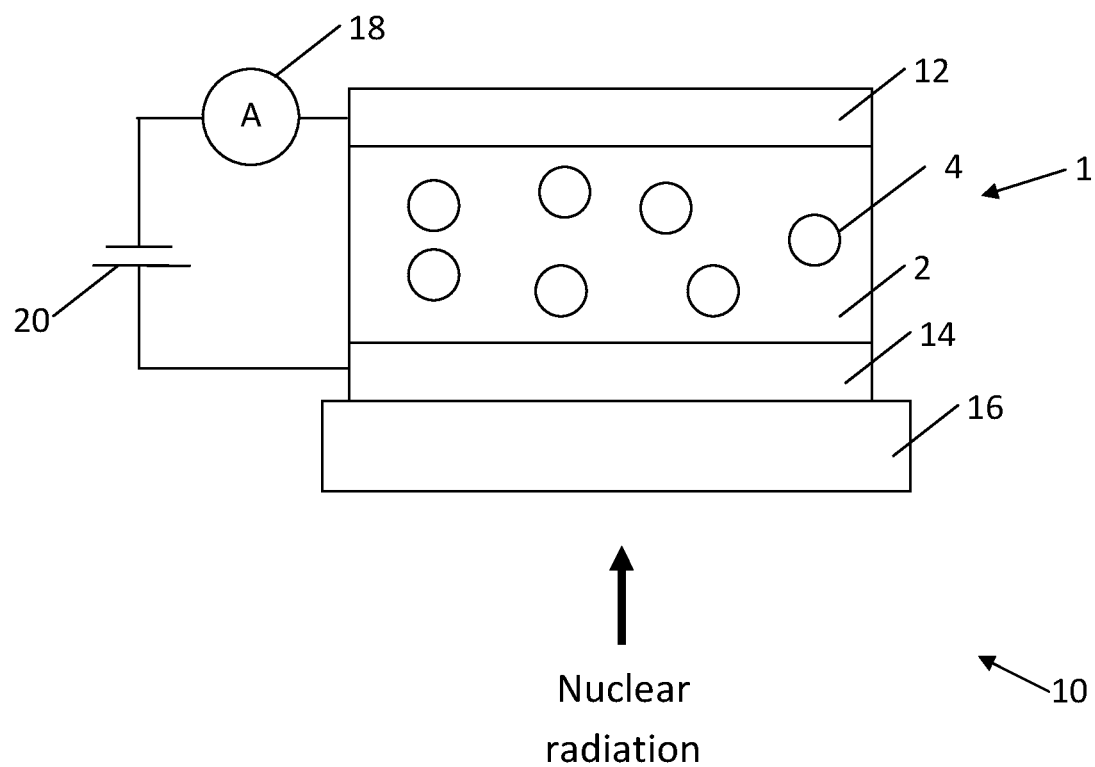
FIG. 3 shows a circuit including the material of FIG. 2 in accordance with an exemplary embodiment.

FIG. 3 shows a circuit, indicated generally by the reference numeral 10, including the material 1 described above with reference to FIG. 2. The circuit 10 also comprises a first electrode 12, a second electrode 14, a substrate 16, a current measuring device 18 and a voltage source 20 (such as a battery). As shown in FIG. 3, the material 1 is sandwiched between the first and second electrodes.

As denoted by the arrow in FIG. 3, radiation is received at the circuit 10. The radiation interacts with the material 1 and generates a current that can be detected by the current measuring device 18 in the manner described in detail below.

The material 2 forms a bulk heterojunction (BHJ). The BHJ (the material 2) is an interpenetrating network of an organic hole transporter/p-type semiconductor/electron donor and an organic electron transporter/n-type semiconductor/electron acceptor. The interaction between these electron donor and acceptor materials results in the formation of electrical junctions (or nanoscale diodes) that are present throughout the volume of the device. The close proximity of the electrical junctions to the nanoparticles (NPs) 4 allows the maximum number of charge carriers to be removed as electrical current (and hence to be detected by the current measuring device 18). In other words, the nanoparticles are located in an intrinsically in-built depletion region. The BHJ assists in the removal of charge carriers from the entirety of the active polymer layer. Hence, these systems can be operated under very low voltages (<10 V), or even at 0 V. Such low voltage operations are ideal, especially in the case of portable radiation monitors that generally require a low voltage source (e.g. the voltage source 20) such as batteries that enable the operation of the detector 10. Optimally, the thickness of the active layer has to be high (~1-100 μm range) so as to capture the maximum percentage of the incident radiation, while still allowing efficient extraction of the charges towards the electrodes.

It should be noted that the use of a voltage source is not essential in all embodiments. Further, the use of a current detector is not essential in all embodiments, since the determination of charge generation can be carried out in other ways.

As the radiation attenuation coefficient of organic materials (i.e. low Z constituents such as carbon and hydrogen) is low, the BHJ active organic material 2 alone attenuates very little of the incoming radiation. The presence of the high Z nanoparticles 4 aids in attenuating the incoming radiation, allowing direct generation of electrical charge carriers to produce a detectable electrical current. In general terms, nanoparticles used in the embodiments described here conform at least to the definition given in the ASTM E2456-06 standard (ASTM E2456-06(2012), Standard Terminology Relating to Nanotechnology, ASTM International, West Conshohocken, Pa., 2012, www.astm.org). In this specification, the term "nanoparticle" is generally used to refer to a particle having at least one dimension of less than 100 nm.

The performance of the detector is typically dependent on the nanoparticle size. If the nanoparticle size is in the quantum regime, i.e. the particle size range where quantum mechanical effects dominate over bulk properties, the radiation interaction with the nanoparticle creates an exciton (which is a bound electron-hole pair), which requires an additional step to be separated into free carriers. Hence, the generation of the current is not as efficient as charges being created as free carriers. Therefore, nanoparticles whose sizes lie in the quantum dot regime are not considered here.

Furthermore, too large nanoparticles cause inefficient packing within the active material, and consequently reduces the number of junction diodes within the BHJ local to the nanoparticles, hence reducing the efficiency of the detector. Larger nanoparticles can also cause the diode-like behaviour of the device to be affected and causes it to behave as a resistor. Hence, the size of the nanoparticles 4 has to be optimum so that the charge generation and extraction occur under the most efficient pathway.

As the dimensions of the nanoparticles are larger compared to the wavelength of the ionizing radiation, the latter undergoes Mie scattering resulting in an increase in the path length. This scattering effect is increased as the particle size approaches the higher end of the limit set above. However, as the charge extraction generally takes place from a 10-15 nm depth from the nanoparticle size, a majority of the deposited X-ray energy is converted to heat for the larger nanoparticles.

While the charge extraction is more efficient as the size approaches the lower limit of the dimensions mentioned above (i.e. the quantum dot regime), the scattering effect is significantly reduced. Therefore a particle size in the range of 20-100 nm may be preferred (e.g. for X-ray radiation). The use of nanoparticles as defined here also enables broadband sensing of X-rays (i.e. detection of X-rays from 1 keV and above) due to the ionizing radiation scattering effects. Furthermore, the sensitivities of current direct X-ray detectors are limited to a very narrow energy range (e.g. amorphous selenium which is one of the most widely used direct X-ray detector materials is incapable of detecting X-rays with energies above 50 keV).

The direct radiation detector 10 directly converts the incident high energy radiation into a detectable electrical signal in one step. In other words, this detector does not involve additional conversion steps such as the generation of visible light, as with scintillator detectors, or the generation of excitons, as seen in scintillator detectors and quantum nanoparticle detectors etc.

Figure 4:
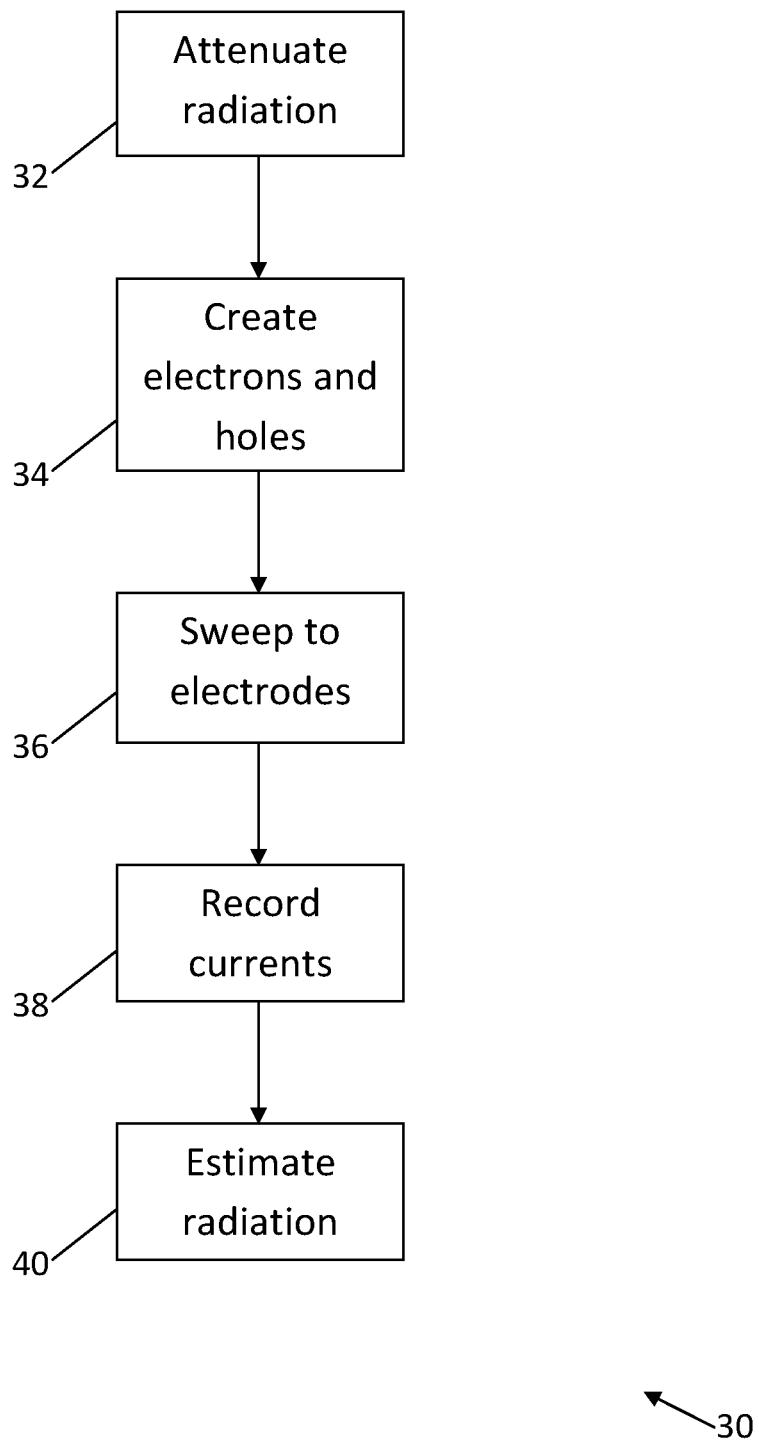
FIG. 4 is a flow chart showing an exemplary use of the circuit of FIG. 3.

FIG. 4 is a flow chart showing an algorithm, indicated general by the reference numeral 30, showing an exemplary use of the circuit of FIG. 3. As shown in the algorithm 30, the proposed direct radiation detector 10 may work as follows.

The algorithm 30 starts at step 32, where the material 1 is used to attenuate incoming radiation. Specifically, the high Z nanoparticles 4 present in the bulk material 2 of the BHJ active layer attenuate the incident high energy radiation.

As indicated in step 34 of the algorithm 30, the radiation interaction with the nanoparticles results in the creation of electron and hole free charge carriers.

At step 36, the generated electron and hole free charges are swept through the organic BHJ matrix towards the electrodes 12 and 14 with the aid of an applied voltage bias (e.g. applied by the voltage source 20, if provided). (The charges can also be swept out by the in-built potential of the detector enabling the operation under 0 V bias, i.e. omitting the voltage source 20.)

Charges as described above with reference to step 36 are collected at the electrodes and the current is recorded (step 38 of the algorithm 30). Calibration can be undertaken to relate current output to incident radiation dose. Note that step 38 can, in some embodiments, be implemented in a different way—calibrated current detection is described by way of example only.

Finally, at step 40, an estimate of the incident radiation is determined, based on the current detected in step 38 (and possibly based on calibration steps).

There are many potential applications for radiation detectors, such as the detector 10 (or any of the other detectors described below). One potential application is a portable dosimeter.

As a first example, a single detector can be interfaced with:
A wireless transmitter that enables real time data transmission to a remote computer that in turn enables (i) a record to be maintained of the radiation dose a user of the dosimeter is exposed to over time (ii) generate a warning mechanism that will inform the user of a potential radiation hazard.
A system integrated with the detector that either generates a warning signal (e.g. a noise) and/or consists of a display that indicates the radiation levels in the surrounding.
A system that combines both the features above.

Examples for powering such systems include an indoor solar cell that harvests light from the lighting conditions in the environment, a battery (e.g.; coin cells, flexible or rigid batteries), or an energy storage device such as a supercapacitor. It is envisaged that this can also be extended to a situation where the power is supplied by a wired connection.

The dosimeter setup can be extended to integrate multiple detectors each of which can detect either different types of radiation (e.g. neutrons and X-rays), or identify the different energies of a particular radiation or a mixture of both.

The entire system can be integrated either on a rigid backing or a flexible backing such as on a sheet of plastic or a plaster among others.

Furthermore, given that the material of the detector 10 can be made flexible, a dosimeter can be fixed in a location of interest, such as by being wrapped around a pipe.

An optimised detector signal depends on the charge collection. Given the attenuation of the radiation throughout the detector, the charges ideally need to be collected from the entirety of the active device layer. A single carrier type organic semiconductor system only produces an electrical junction that favours charge extraction at one electrode. Consequently, carriers are only removed at this interface as the opposite electrode acts as a barrier for extraction of the opposite charge. (Note that this is only the case if the two contacts have different work functions.) The BHJ system as described above produces electrical junctions throughout the active material where charges are extracted through both electrodes. This increases the probability of extraction of both types of charge carriers generated by the high energy radiation.

The effects of these mechanisms described above can be seen in the attenuation of typical materials at different photon energies (<0.1 MeV—photo electric effect, 0.1-10 MeV—Compton scattering, and >10 MeV—pair production). These effects are further enhanced by the Mie scattering of ionising radiation that takes place due to the nanoparticles being slightly larger than the wavelength of the ionising radiation.

Figure 5:
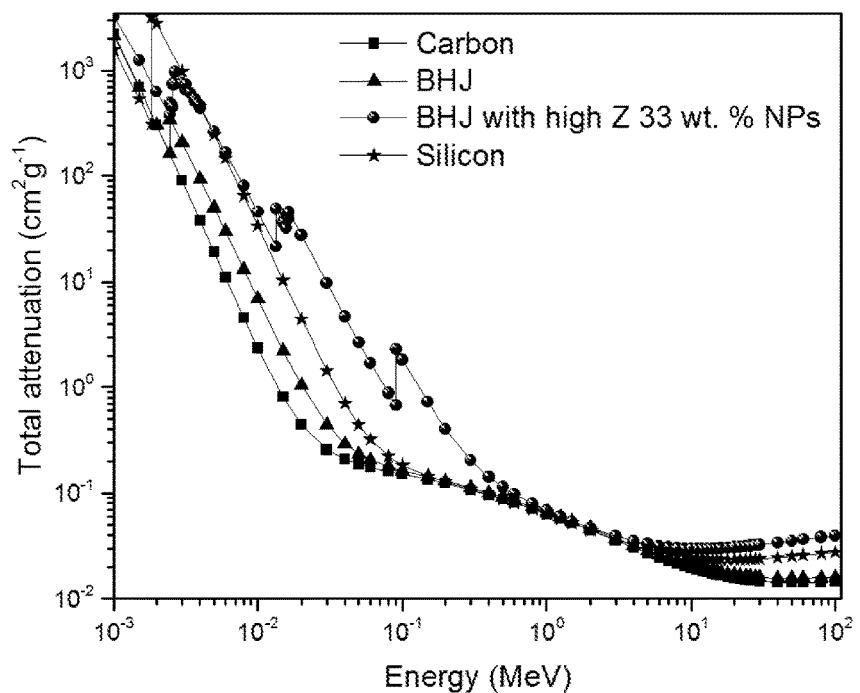
FIG. 5 is a graph showing bulk X-ray attenuation by some materials as a function of photon energy.

FIG. 5 is a graph, indicated generally by the reference numeral 50, showing bulk X-ray attenuation by some materials as a function of photon energy. The total attenuation of carbon, silicon, BHJ and BHJ-NP compounds as a function of the photon energy are shown. The values have been calculated using the NIST XCOM software for bulk materials and does not take into consideration scattering effects due to nanoparticles (http://physics.nist.gov/PhysRefData/Xcom/html/xcom1.html).

As shown in FIG. 5, the introduction of high Z nanoparticles into an organic matrix can significantly increase the attenuation of the organic layer to above that for Silicon, especially in the photoelectric effect and pair production regions of the spectrum.

Experimental Example

The following results and discussion are based on a direct radiation detector made out of an organic donor and an organic acceptor-based BHJ system. In our example system, poly(3-hexylthiophene-2,5-diyl): [6,6]-Phenyl C71 butyric acid methyl ester (P3HT:$PC_{70}BM$) bulk-heterojunction active material, and Bismuth Oxide ($Bi_2O_3$) have been used as the organic BHJ (the bulk material 2) and high Z NPs (the nanoparticles 4) respectively. Aluminium and indium tin oxide (ITO) are used as the cathode and anode electrodes respectively (the electrodes 12 and 14 of the detector 10).

Regioregular poly(3-hexylthiophene-2,5-diyl) (P3HT, 40 mg, Rieke 4002 EE) and [6,6]-Phenyl $C_{71}$ butyric acid methyl ester ($PC_{70}BM$, 40 mg, 99% pure; Solenne) were added to 1 ml of dichlorobenzene to produce a P3HT:$PC_{70}BM$ ($Bi_2O_3$-0) solution. $Bi_2O_3$ nanoparticles (β phase with a tetragonal crystal structure; 38 nm diameter; surface area 18 $m^2$ $g^{-1}$; Alfa Aesar) were dispersed in P3HT:$PC_{70}BM$ solution to give a $Bi_2O_3$ concentration of 40 ($Bi_2O_3$-40) mg $ml^{-1}$. The NP weight percentage (wt %) of this device is 33%.

On the ITO ($In_2O_3$:Sn) glass substrate (15 mm×15 mm), an electron blocking and hole transporting layer (HTL) of Poly(3,4-ethylenedioxythiophene)-poly(styrenesulfonate) (PEDOT:PSS; Al 4083; Heraeus) was spin coated in air (at 5000 rpm for 40 s) and annealed at 150° C. for 10 minutes to give a thickness of 40 nm. A volume of 90 µl of $Bi_2O_3$-0 and $Bi_2O_3$-40 solutions were coated and annealed at 60° C. for 20-40 minutes under a closed petri dish. This was followed by annealing at 140° C. for 10 minutes. The devices were not placed under a covered petri dish for the second annealing step. Devices were kept under vacuum at a pressure of less than 3×10⁻⁶ mbars for 24 hours to remove any residual solvent. This was followed by the deposition of an electron transporting (ETL) and hole blocking layer, 1-2.9-dimethyl-4,7-diphenyl-1,10-phenanthroline (BCP; sublimed grade, Sigma Aldrich, 99.99% purity, 5 nm thickness) and with the deposition of an Al cathode (~120 nm) by evaporation. Device encapsulation was carried out using an encapsulation glass slide and UV light cure adhesive glue (Ossila) illuminated under a UV lamp for 5 minutes. The HTL and ETL, and electrode materials, can be interchanged with any such materials suitable for the application which optimize extraction of charge carriers from the BHJ active material.

Figure 6:
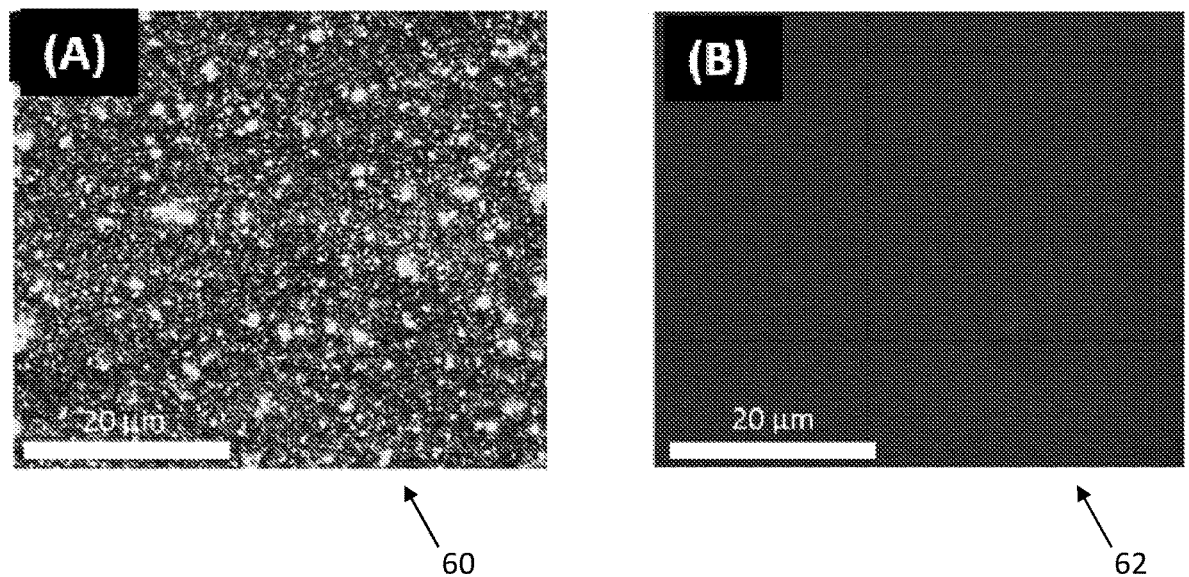
FIG. 6 shows scanning electron micrograph (SEM) images of an exemplary embodiment.

FIG. 6 shows scanning electron micrograph (SEM) images of an exemplary embodiment. In particular, FIG. 6 shows an SEM image 60 of the surface of a first device (A) containing the organic BHJ with nanoparticle loading of 33 wt. % (as discussed above) and an SEM image 62 of the surface of a second device (B) containing only the organic BHJ (i.e. nanoparticle-free) surface.

The SEM images shown in FIG. 6 allow the observation of the microstructure of the film under the presence of NPs. FIG. 6 displays the micrographs of the samples, recorded over an area of 50×50 μm². From the SEM images, the presence of nanoparticles is evident and that the nanoparticles are not located solely at the bottom of the device, suggestive that the distribution of nanoparticles is uniform throughout the organic BHJ layer. SEM images appear to indicate that the structuring of the film is more prominent for the film (the image 60) with NPs where the surface variation is almost negligible for NP-free surface (the image 62).

Figure 7:
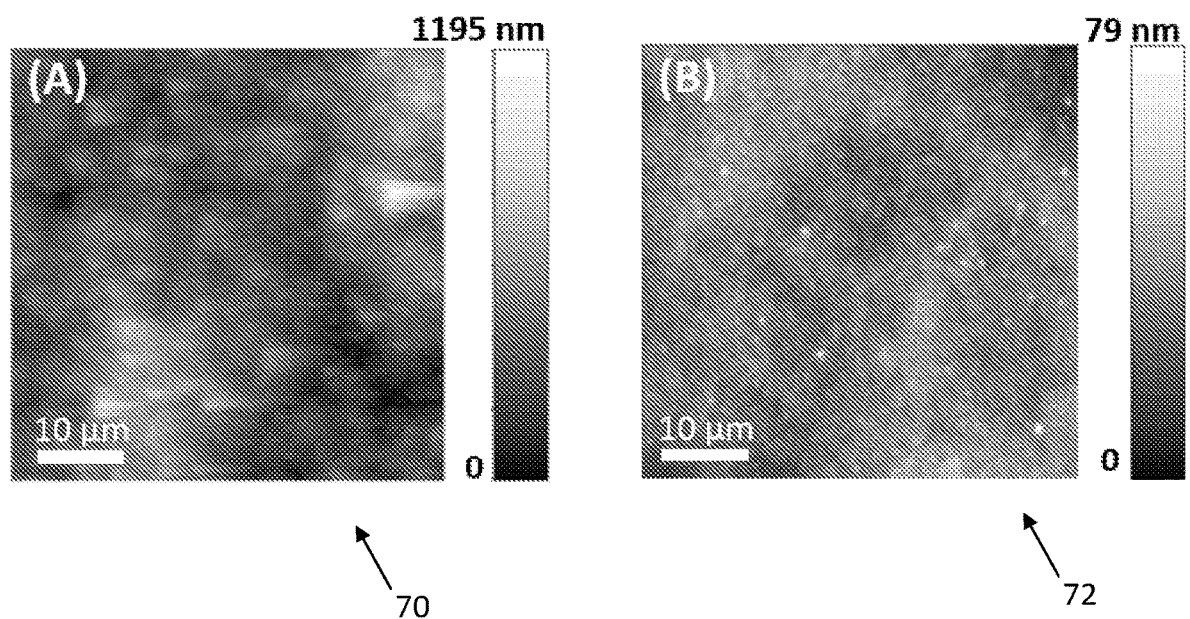
FIG. 7 shows atomic force microscopy (AFM) images of an exemplary embodiment.

FIG. 7 shows atomic force microscopy (AFM) images of an exemplary embodiment. In particular, FIG. 7 shows a first AFM image 70 of the first device containing (A) the organic polymer with NP loading of 33 wt. % (as described above), and a second AFM image 72 of the second device (B) containing only the organic polymer (NP-free) surface.

The surface roughness of the hybrid thick film can have an impact on the dark leakage currents and device performance. Hence, atomic force microscopy (AFM) was performed to evaluate the surface roughness of the deposited layers. The root mean square (r.m.s) roughness values are 153.4 and 6.6 nm for 33 wt. % NP loaded device and NP-free device respectively. From the values obtained it is evident that the presence of NPs leads to increase the surface roughness of the films by almost 20 times than that of the NP-free surface.

Figure 8:
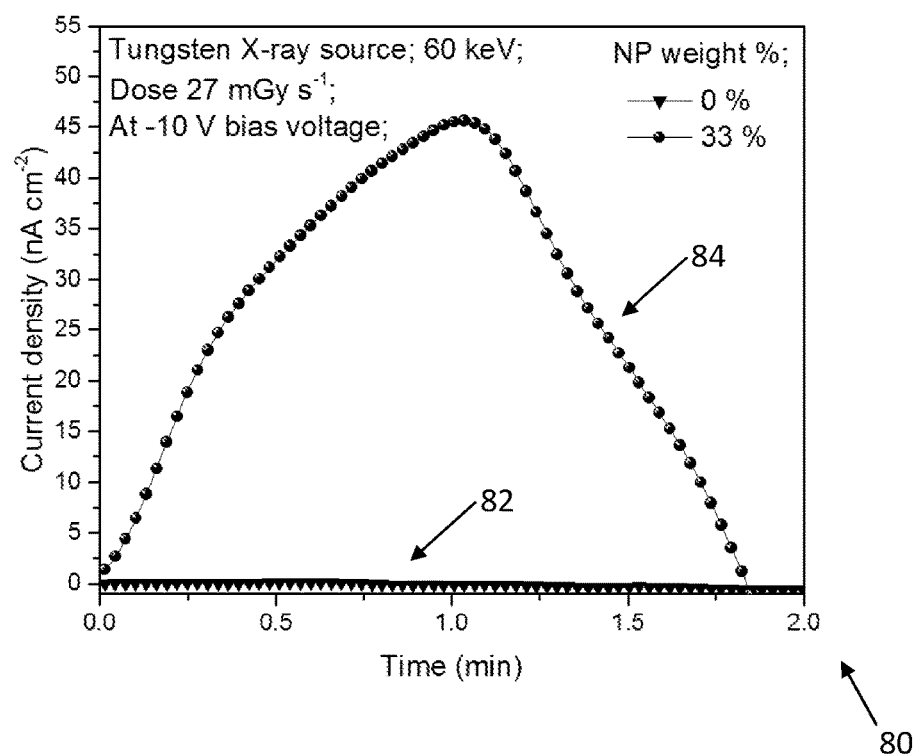
FIG. 8 is a graph demonstrating an aspect of an implementation of an exemplary embodiment.

FIG. 8 is a graph, indicated generally by the reference numeral 80, demonstrating an aspect of an implementation of an exemplary embodiment. Specifically, FIG. 8 shows a time dependent X-ray response for the NP free device (plot 82) and the device with 33 wt. % loading of NPs (plot 84). Devices were irradiated with a 60 keV Tungsten X-ray source for 1 minute, under 27 mGys⁻¹ dose rate at −10 V reverse bias voltage. The X-ray source was alternatively switched on and off for a period of 1 minute, and irradiated under a dose rate of 27 mGys⁻¹ (equivalent to a total dose of 1.62 Gy). The device with pure organic material (NP-free device) exhibits almost a zero X-ray response (see plot 82). However, the current response drastically increased in the presence of 33 wt. % of NPs in the BHJ matrix exhibiting a value of 46 nA cm⁻² (see plot 84). Under such low operating voltages, this is the highest recorded X-ray response for direct organic X-ray detectors.

Figure 9:
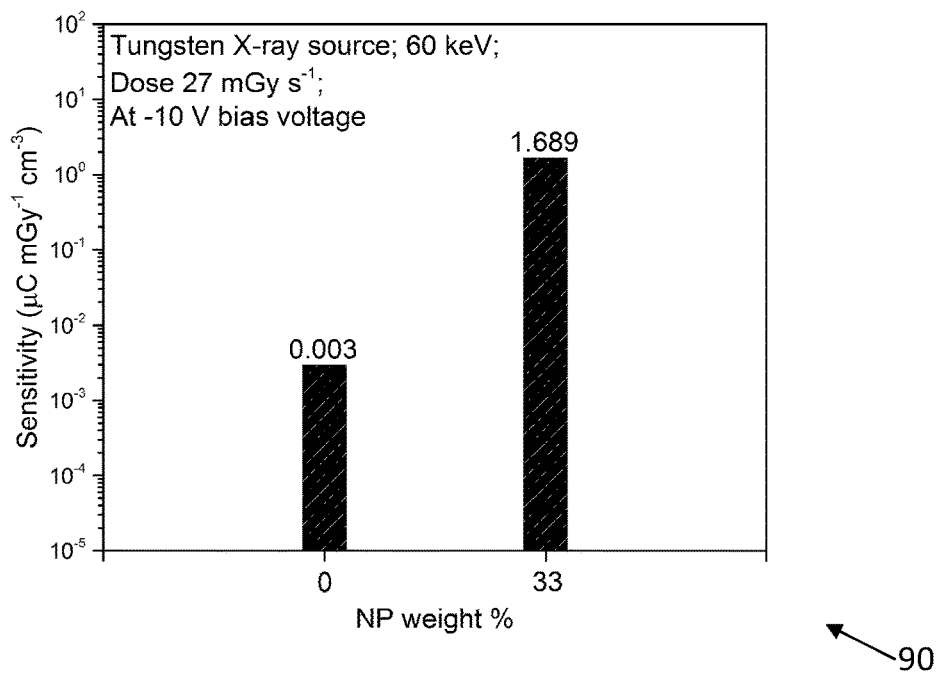
FIG. 9 is a chart demonstrating an aspect of an implementation of an exemplary embodiment.

FIG. 9 is a chart, indicated generally by the reference numeral 90, demonstrating an aspect of an implementation of an exemplary embodiment. Specifically, FIG. 9 shows the sensitivities of the devices with (33 wt. %) and without NP loadings (0%). X-ray responses were obtained at −10 V reverse bias voltage under a dose rate of 27 mGy s⁻¹.

Thus, FIG. 9 depicts the sensitivity of the device with respect to the presence of NPs. The reference device, which has no NPs, exhibits almost zero sensitivity (0.003 μC mGy⁻¹ cm⁻³). This illustrates that the majority of radiation attenuation is due to the inclusion of the high Z NPs within the organic matrix. However, the addition of 33 wt. % of NPs into the organic BHJ matrix boosts sensitivity to almost 1.7 μC mGy⁻¹ cm⁻³.

Figure 10:
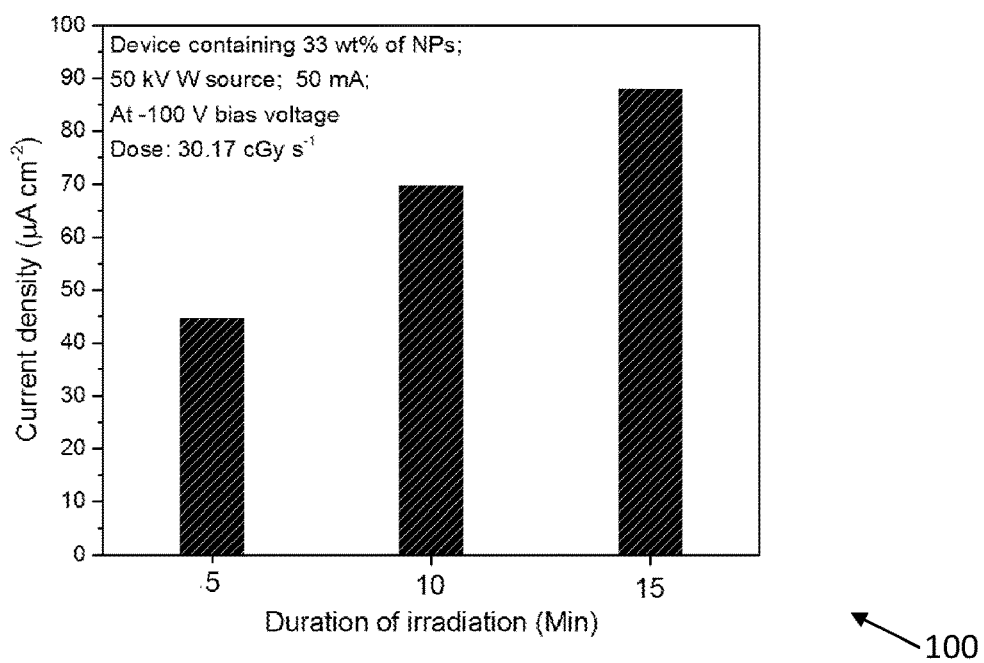
FIG. 10 is a chart demonstrating an aspect of an implementation of an exemplary embodiment.

FIG. 10 is a chart, indicated general by the reference numeral 100, demonstrating an aspect of an implementation of an exemplary embodiment. Specifically, FIG. 10 shows a time dependent X-ray response for the device with 33 wt % NPs. The device was irradiated with a 50 keV Tungsten X-ray source for 15 minutes, under 30.1 cGys⁻¹ dose rate, at ~100 V reverse bias voltage. FIG. 10 gives the X-ray response with a peak value of ~90 μA cm⁻², when the device was irradiated for continuous 15 minutes for a total dose of 271.53 Gy.

Figure 11:
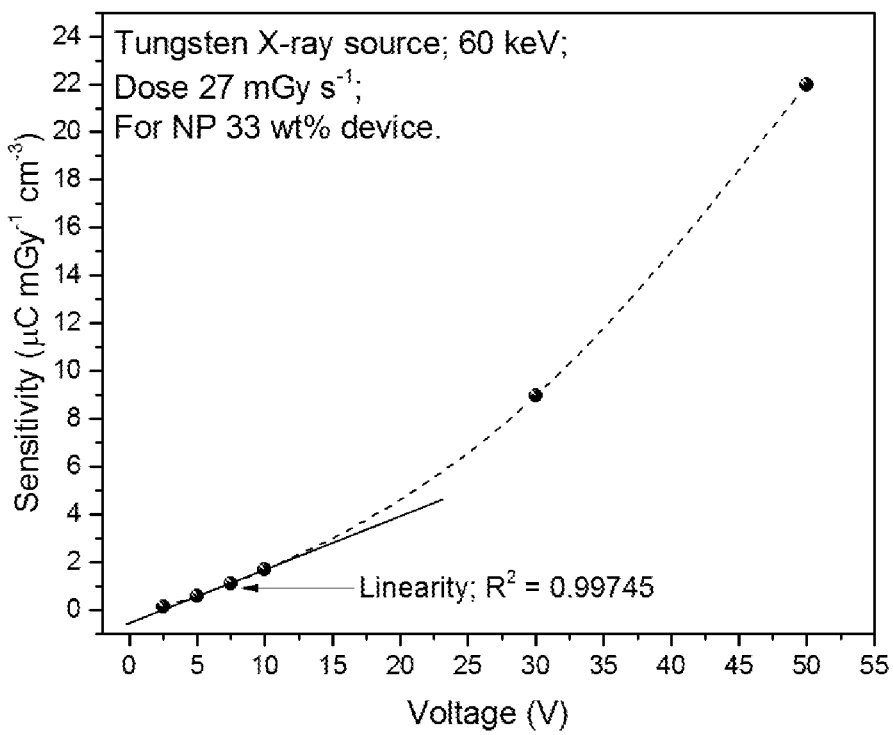
FIG. 11 is a graph demonstrating an aspect of an implementation of an exemplary embodiment.

FIG. 11 is a graph, indicated generally by the reference numeral 110, demonstrating an aspect of an implementation of an exemplary embodiment. Specifically, FIG. 11 shows sensitivity as a function of voltage variation for the 33 wt. % NP device. As shown in FIG. 11, the X-ray response of the devices greatly depends on the applied voltage bias. FIG. 11 illustrates the device response for a wider range of operating voltages for the 33 wt % NP device. At low voltages, <5 V, the device produces a sensitivity of 0.131 μC mGy⁻¹ cm⁻³ and sensitivity increases linearly, with a linear regression ($R^2$) value of 0.99745, in the low voltage regime (2.5-10 V), confirming that the device can be battery operated for portable applications. Thus, results show the use of high Z NPs efficiently attenuates the incoming radiation and the thick layer of BHJ active material aids in sweeping both electrons and holes towards the electrodes for a current response. As the NPs are placed in an already in-built depletion region, charges can be extracted at either almost near zero or zero voltages. The example study given here explains the high sensitivity performance under the irradiation of X-rays at both low and high voltages.

Because of their nanometer-size, nanoparticles can advantageously be added to the semiconductor polymer without being inter-connected and creating a short-circuit. NPs with a high atomic number (Z) are strong attenuators of radiation, whereas low-Z polymers or organics are not. X-ray detectors, a high photon flux application where detector sensitivity does not limit the measurement, are currently widely based on inflexible solid-state silicon photodiode detectors. In comparison, a P3HT:PC$_{70}$BM diode containing 33 wt. % $Bi_2O_3$ NPs will attenuate more high energy X-rays (>1 MeV), up to approx. 80% more attenuation at energies above 50 MeV (considering bulk attenuation effects alone). At lower energies (<1 MeV), the P3HT:PC$_{70}$BM:Bi$_2$O$_3$ diode will attenuate up to six times more incident radiation than will the silicon diode, while retaining the flexibility of polymers or organic films. The detector films on their own have an energy dependence that is close to that of human tissues (tissue equivalence) making them attractive for radiotherapy applications. This tissue equivalence will worsen for NP loaded polymer films as the concentration of NPs increases, but the inclusion of the NPs improves the quantum efficiency of the diodes. Even with a low concentration of $Bi_2O_3$ NPs the polymer films are potentially seen to be more sensitive to X-rays than Silicon at a range of energies. For radiotherapy applications a compromise may have to be determined between tissue equivalence and increased sensitivity.

Because of the mechanical flexibility of the detector, it can be folded. Hence, multiple layers of the polymer/organic semiconductor/NP film can be used to attenuate even more of the incident radiation. Improvement of the charge generation and collection from these light-weight, flexible organic semiconductor/polymer/NP materials would potentially allow for their integration into disposable adherent plasters to allow for short duration, real-time detection/imaging of radiation beams.

Organic semiconducting diodes lend themselves to a high spatial resolution and can adapt to directional dependence. Organic semiconductor or polymer diodes can be produced with sub-micrometer dimensions, over large areas, and on flexible substrates, and a combination of these technologies will allow them to be positioned three-dimensionally in an incident radiation beam. As dose is a one-dimensional quantity, a dosimeter with a small volume will have a high spatial resolution. The ability to 'fold' a single polymer organic semiconductor detector so that the incident beam passes through it multiple times allows for greater detector sensitivity. Finally, the rugged, solid-state, semiconducting organic diodes offer the advantage of a real-time electrical response, which can be directly read out, and low operating voltages, which may allow them to be battery operated, increasing their portability.

It should be noted that other materials that can be used as cathode include n-type graphene, n-type carbon nanotubes, chromium, titanium, calcium, barium or similar materials with low work function as well as bilayer cathode systems that include a metal/metal oxide combination where the metal oxide can be zinc oxide, titanium oxide, chromium oxide or metal/organic combinations where the organic system can be bathocuproine of polyethyleneimine or its derivatives, poly fluorines such as (PFN).

Other materials that can be used as anode include high work function materials such as gold, nickel, graphene, combination of metal/metal oxides where the metal oxide can be based on tungsten, molybdenum, nickel or metal/organic where the organic can be PEDOT:PSS, PTAA, F8T2, spiro-MEOTAD, P3HT or any p-type polymer.

The same architecture as described can be implemented to a variety of organic BHJ semiconductors and high Z NPs. In terms of the BHJ, Benzol[1,2-b 4,5-b']dithiophene based materials, family of polythiophenes, poly(phenylenevinylene)s, family of carbazole etc can be used as electron donor materials and fullerene derivatives, ITIC, n type metal oxides, Vinazene derivatives, aromatic ring acceptors etc. can be used as electron acceptor materials. Pure metallic or compound high Z NPs, containing elements such as tantalum, tungsten, bismuth, lead, platinum, gold, cadmium etc. are some of the choices for NPs. Lead based materials would be a good choice for the NPs, given their proven radiation attenuation, but are less favoured due to their environmental toxicology.

More details of exemplary materials are provided below.

For fabrication, active material deposition for large area production can be carried out using different roll-to-roll or sheet-to-sheet coating techniques such as, spray coating, slot-die coating, ink-jet printing, gravure printing, flexographic printing, powder pressing etc. It should be noted that the invention can be further extended up to the detection of other ionising (e.g. nuclear) radiation such as alpha particles, beta particles, neutrons and gamma rays while retaining the same configuration. This can be achieved by using an appropriate nanoparticle. For neutron detection Li-6 or B-10 containing NPs such as lithium fluoride, boron carbide, boron nitride etc can be used. For gamma ray detection, High Z NPs above Z=13 like bismuth, tantalum, tungsten, lead, gold, platinum can be used and alloys such as cadmium telluride (CdTe), perovskites (lead based and others) and compound high Z NPs such as Bi2O3. nanodiamonds etc. For alpha and beta particle detection any carbon-based material can be used including graphene, amorphous carbon, carbon nanotubes and all allotropes of carbon. Si-based NPs and nanowires, Silver (Ag) based NPs and nanowires, Zinc (Zn) NPs and any type of metals and alloys (NPs or micron size particles) can be used for alpha and beta particle detection.

As described above, radiation detectors described herein include a network having a first material for transporting positive electric charges and a second material for transporting negative electric charge, with nanoparticles being dispersed within the network. FIGS. 12 to 17 described further below include a number of arrangements of the first and second materials and the nanoparticles. It will be appreciated that the arrangements shown in FIG. 12 to 17 are provided by way of example; other arrangements are possible.

Figure 12:
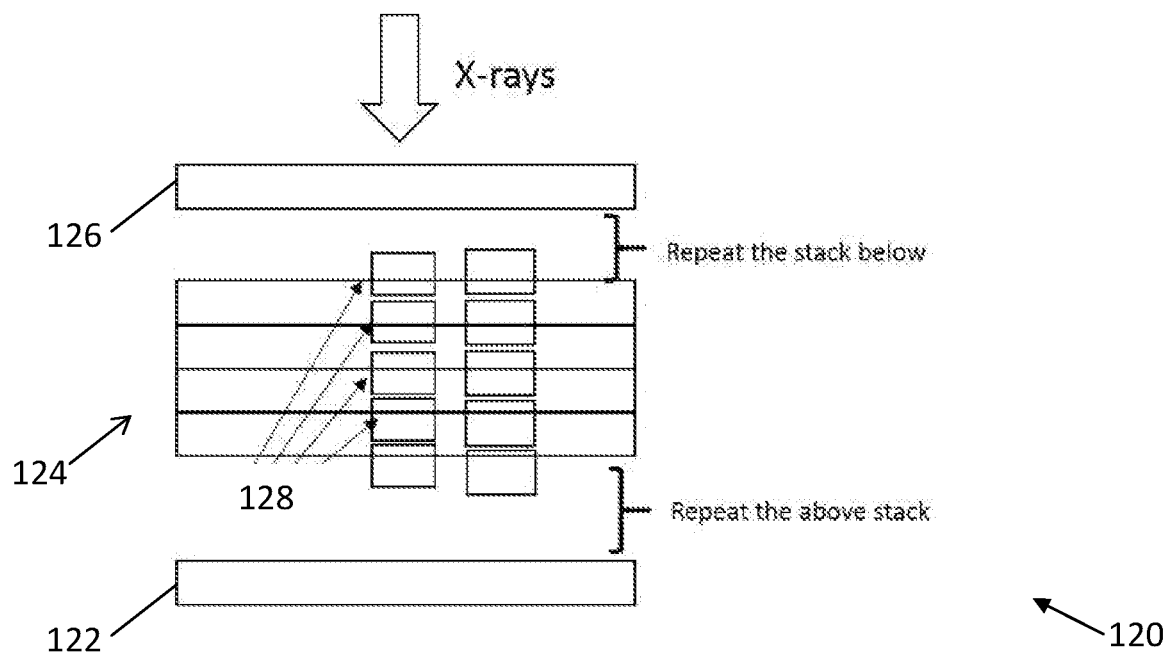
FIGS. 12 to 17 are radiation detection arrangements in accordance with exemplary embodiments.

FIG. 12 shows a radiation detection arrangement, indicated generally by the reference numeral 120, in accordance with an exemplary embodiment. The arrangement 120 includes a stacked arrangement of layers. In one implementation, the first layer 122 is an electron transporting layer, the final layer 126 is a hole transporting layer and the stack 124 represents stacked electron and hole transporting layers. As shown schematically in FIG. 12, a number of nanoparticles 128 are provided between the layers of the stack. Thus, the stack provides the first and second materials of a radiation detection arrangement described above. The nanoparticles may be provided at the junction of the first and second materials (i.e. the hole and electron transporting layers) in order to maximise the extraction of charged particles (when those particles are generated from the incoming X-rays or some other radiation source). For example, the layers of the stack may be fabricated in turn, with nanoparticles being provided on top of each layer before the next layer of the stack is added. Note the first layer 122 could be a hole transporting layer. Similarly, the last layer 128 could be an electron transporting layer.

Figure 13:
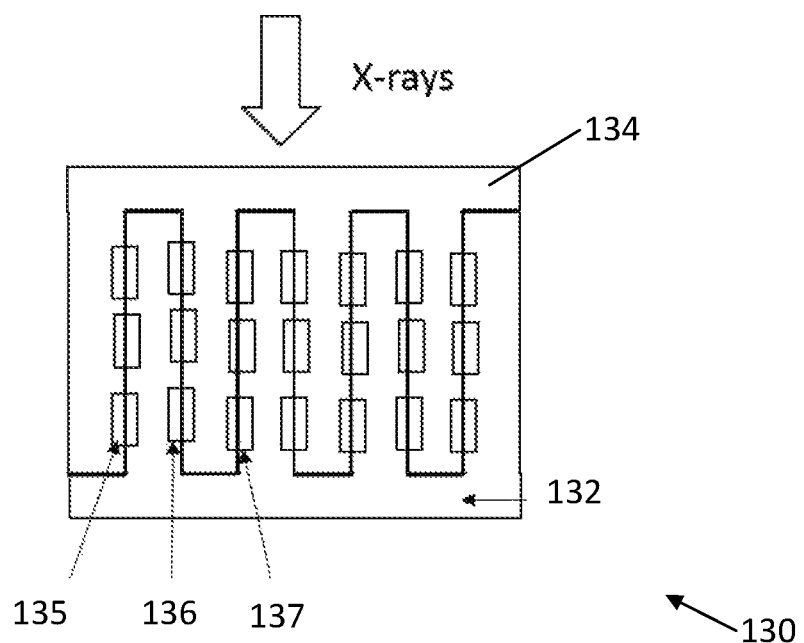

FIG. 13 shows a radiation detection arrangement, indicated generally by the reference numeral 130, in accordance with an exemplary embodiment. The arrangement 130 includes an interdigitated arrangement of layers. In one implementation, a first set of fingers 132 is an electron transporting material and the second set of fingers 134 is a hole transporting material (clearly, these materials could be reversed). As shown schematically in FIG. 13, a number of nanoparticles (such as nanoparticles 135, 156 and 137) are provided between the fingers of the electron and hole transporting materials. Thus, the stack provides the first and second materials of a radiation detection arrangement described above and the nanoparticles may be provided at the junction of the first and second materials (i.e. the hole and electron transporting layers) in order to maximise the extraction of charged particles (when those particles are generated from the incoming X-rays or some other radiation source). The arrangement 130 is well suited to being made used 3D printing techniques.

Figure 14:
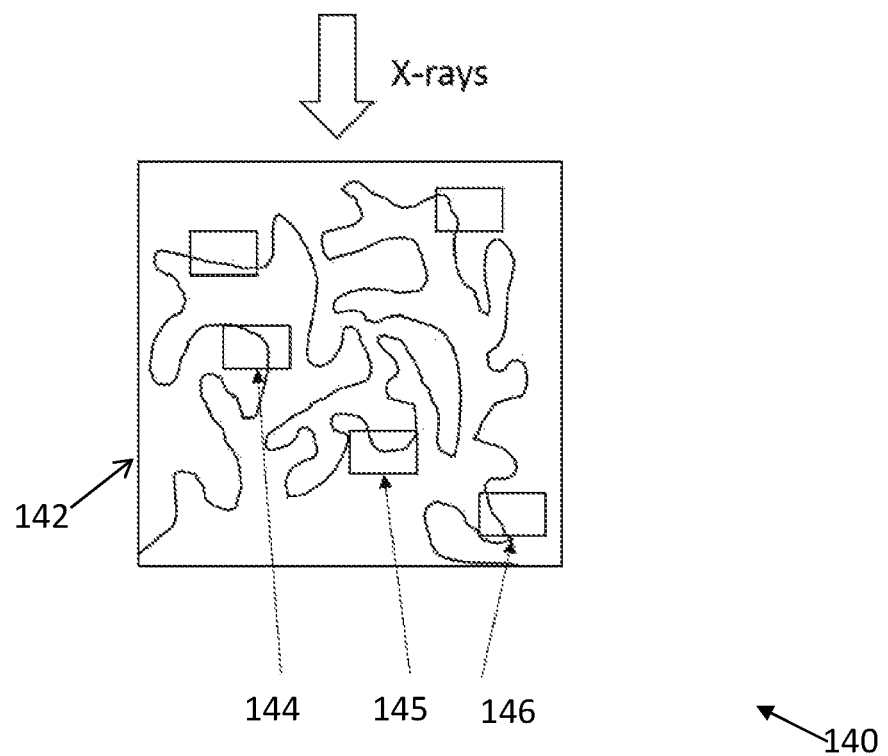

FIG. 14 shows a radiation detection arrangement, indicated generally by the reference numeral 140, in accordance with an exemplary embodiment. The arrangement 140 includes a matrix 142 that is formed of a mix of an electron transporting material and a hole transporting material. As shown schematically in FIG. 14, a number of nanoparticles (such as nanoparticles 144, 145 and 146) are provided within the matrix. Where nanoparticles are provided at the junction of the hole and electron transporting layers (which may occur randomly), incoming X-rays (or other radiation) will be converted into free electron and hole pairs and transported by those layers.

Figure 15:
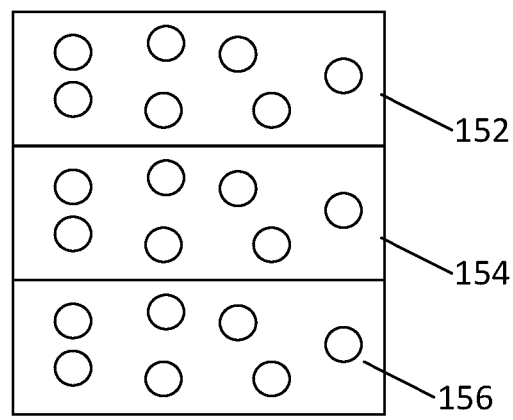

FIG. 15 shows a radiation detection arrangement, indicated generally by the reference numeral 150, in accordance with an exemplary embodiment. The radiation detection arrangement 150 includes a first device 152, a second device 154 and a third device 156. The devices 152 to 156 are stacked vertically in the arrangement as shown in FIG. 15. The devices 152 to 156 each comprise a bulk heterojunction with nanoparticles dispersed therein and may, for example, be any of the radiation detection arrangements described herein, such as the radiation detection arrangements 1, 10, 120, 130 and 140 described above. It should be noted that the devices 152, 154 and 156 need not necessarily be in physical contact, as shown in FIG. 15

Figure 16:
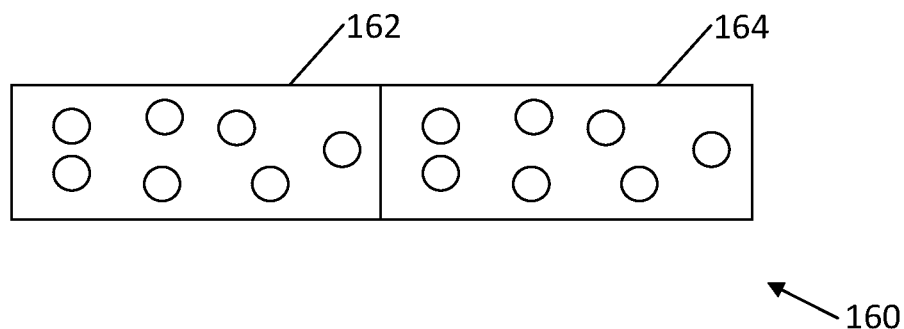

FIG. 16 shows a radiation detection arrangement, indicated generally by the reference numeral 160, in accordance with an exemplary embodiment that is similar to the arrangement 150 described above. The radiation detection arrangement 160 includes a first device 162 and a second device 164 mounted horizontally as shown in FIG. 16. The devices 162 and 164 each comprise a bulk heterojunction with nanoparticles dispersed therein and may, for example, be any of the radiation detection arrangements described herein, such as the radiation detection arrangements 1, 10, 120, 130 and 140 described above. It should be noted that the devices 162 and 164 need not necessarily be in physical contact, as shown in FIG. 16.

Both the radiation detection arrangements 150 and 160 provide an array of radiation detection devices connected in series or parallel. The various detection devices of an array may be different, for example including different nanoparticles. In this way, different radiation detection devices in an array may be tuned to detect different radiation types. In the radiation detection arrangement 150, the second device 154 may only receive radiation that passes through the first device 152 (with the third device 156 only receiving radiation that passes through both the first and second devices).

Figure 17:
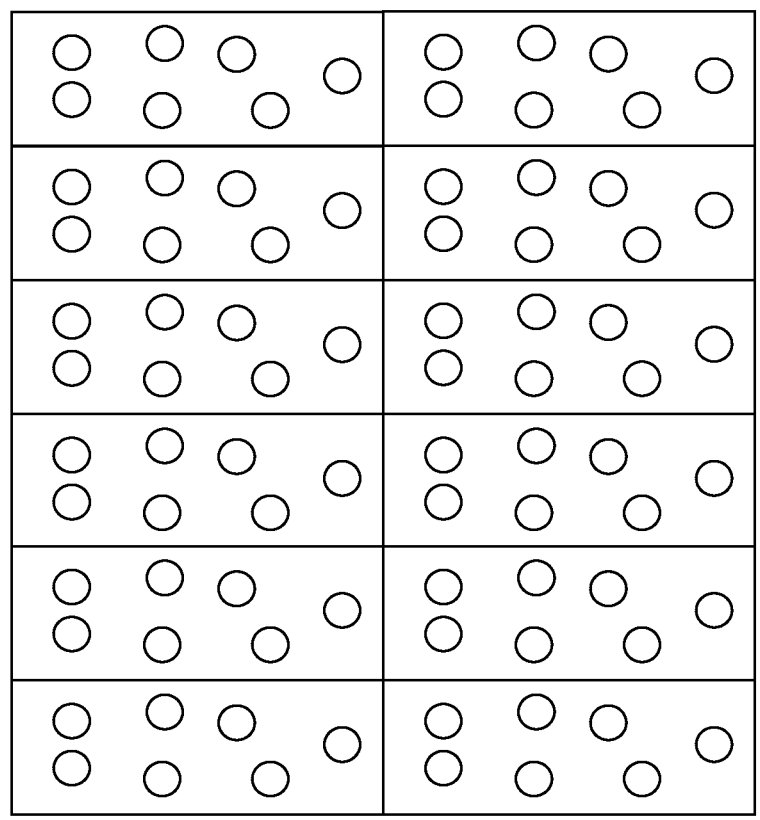

FIG. 17 shows a radiation detection arrangement, indicated generally by the reference numeral 170, in accordance with an exemplary embodiment. The radiation detection arrangement 170 includes a plurality of radiation detection devices in a tiled arrangement. The tiles may form "pixels". At least some of the tiles may be tuned to different radiation types (e.g. by selection of the nanoparticle size and/or material). In some arrangements, some or all of the tiles may be tuned to the same radiation type. The radiation detection arrangement 170 might, for example, be a plan view of a detector. The various detectors that form of the arrangement 170 need not necessarily be in physical contact, as shown in FIG. 17.

The radiation detection arrangement 170 may be referred to in some embodiments as a radiation imager. The radiation imager may include appropriate read-out electronics. Such a radiation imager has many potential applications, as set out below.

The imager can be fabricated either on a flexible backing (substrate, plaster for example) and used, for example, for wearable health monitoring applications. For example, a patch can be envisaged which is worn by a user over an area where there is a wound or an area where bone damage has been detected or over an area where cancerous tissues are present. Due to the highly sensitive nature of each detector pixel, a small X-ray source can be used to periodically observe the healing of wounds, broken bones or any changes in the cancerous tissue.

The imager can also be used for monitoring of metallic objects in environments in which they should not be present. For example, these imagers can be used in food packaging industry to identify potential metallic contaminants in the food. Furthermore, through the use of multi-channel analysing techniques or other appropriate techniques, the imager can also be used to map out which element is present and where.

The technology can be extended for security screening activities at airports, ports, and suspected bomb-sites as an example.

The technology can be used for non-destructive evaluation of mechanical components either during manufacture, or during specified evaluation periods for components in operation or for real time monitoring of the health of the mechanical components by integration into the system itself. The potential flexible nature of the imager enables the advantages of X-ray films (very little restrictions in terms of shapes that be imaged) to be used, but in a digital form (real time imaging possible as opposed to film where real time imaging is not possible).

The detector and imager would be suitable for academic research

The above applications are not restricted to the use of X-rays but also applicable to cases where other forms of ionising radiation can also be used.

In fabricating the detectors, the solution consisting of the mixture of first and second materials (such as hole transporting organic semiconductor (or multiple hole transporting semiconductors) and electron transporting semiconductor (or multiple electron transporting semiconductors)) and nanoparticles can be:

- Deposited directly from solution using solution printing and coating techniques, such as but not limited to slot die coating, doctor blading, gravure printing, flexographic printing, drop casting, 3D printing, inkjet printing, spray coating, dip coating on a flexible or rigid substrate. Furthermore, these inks can also be used to coat wires or filaments as well;
- Deposited directly onto a substrate through thermal evaporation, chemical vapour deposition, pulsed laser ablation, sputter coating techniques;
- Formed into free standing pellets or tiles through the following processing: an anti-solvent in which the organic semiconductors nor the nanoparticles are soluble, but which is at least partially miscible with the organic solvent used is introduced to the ink resulting in the materials used crashing out of the system. The remaining solvent can then be evaporated to obtain a dry powder which can be pressed and sintered if necessary to form a solid, free standing pellet;
- The ink containing the semiconductor can be sprayed under high pressure to a low vacuum system maintained at an appropriate pressure where the solvent is evaporated and the powder is collected. The powder can then be pressed to form a free standing pellet; or The pellet could be pressed onto a substrate consisting of the appropriate electrical contact material or a backplane as described under the X-ray imager.

The physical properties of an ink can also be tuned to enable filaments of this X-ray detector being formed such as through extrusion or electrospinning.

There are provided below (by way of example), table of exemplary materials for use as the first and second materials (i.e. hole and electron transporting materials) and the nanoparticles.

Exemplary Hole Transporting Material:

| Abbreviated name | Full name |
|---|---|
| P3HT | Poly(3-hexylthiophene-2,5-diyl) |
| PCDTBT | Poly[N-9'-heptadecanyl-2,7-carbazole-alt-5,5-(4',7'-di-2-thienyl-2',1',3'-benzothiadiazole)], Poly[[9-(1-octylnonyl)-9H-carbazole-2,7-diyl]-2,5-thiophenediyl-2,1,3-benzothiadiazole-4,7-diyl-2,5-thiophenediyl] |
| PCPDTBT | Poly[2,6-(4,4-bis-(2-ethylhexyl)-4H-cyclopenta [2,1-b;3,4-b']dithiophene)-alt-4,7(2,1,3-benzothiadiazole)] |
| Si-PCPDTBT | poly[2,6-(4,4-bis-(2-ethylhexyl)dithieno[3,2-b:2',3'-d]silole)-alt-4,7-(2,1,3-benzothiadiazole)] |
| PTB7 | Poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]] |
| PCE10, PBDTTT-EFT, PBDTT-FTTE, PTB7-Th | Poly[4,8-bis(5-(2-ethylhexyl)thiophen-2-yl)benzo[1,2-b;4,5-b']dithiophene-2,6-diyl-alt-(4-(2-ethylhexyl)-3-fluorothieno[3,4-b]thiophene-)-2-carboxylate-2-6-diyl)] |
| PCE11, PFFBT4T-2OD | Poly[(5,6-difluoro-2,1,3-benzothiadiazol-4,7-diyl)-alt-(3,3'''-di(2-octyldodecyl)-2,2';5',2'';5'',2'''-quaterthiophen-5,5'''-diyl)] |
| DPP-DTT, PDBT-co-DTT, PTT-DTDPP, PDPP-DTT, DPPTT-TT, DPP-TTT, PDPP2T-TT, PDPP2T-TT-OD | Poly[2,5-(2-octyldodecyl)-3,6-diketopyrrolopyrrole-alt-5,5-(2,5-di(thien-2-yl)thieno [3,2-b]thiophene)] |
| MEH-PPV | Poly[2-methoxy-5-(2-ethylhexyloxy)-1,4-phenylenevinylene] |
| PPDT2FBT | poly[(2,5-bis(2-hexyldecyloxy)phenylene)-alt-(5,6-difluoro-4,7-di(thiophen-2-yl)benzo[c][1,2,5]thiadiazole)] |
| PCE12, PBDB-T | Poly[(2,6-(4,8-bis(5-(2-ethylhexyl)thiophen-2-yl)-benzo[1,2-b:4,5-b']dithiophene))-alt-(5,5-(1',3'-di-2-thienyl-5',7'-bis(2-ethylhexyl)benzo[1',2'-c:4',5'-c']dithiophene-4,8-dione)] |
| DTS(FBTTh$_2$)$_2$, F-DTS, p-DTS(FBTTh$_2$)$_2$ | 7,7'-[4,4-Bis(2-ethylhexyl)-4H-silolo[3,2-b:4,5-b']dithiophene-2,6-diyl]bis[6-fluoro-4-(5'-hexyl-[2,2'-bithiophen]-5-yl)benzo[c][1,2,5]thiadiazole] |
| PCDTFBT (PFT-100) | Poly[(5-fluoro-2,1,3-benzothiadiazole-4,7-diyl)(4,4-dihexadecyl-4H-cyclopenta[2,1-b:3,4-b']dithiophene-2,6-diyl)(6-fluoro-2,1,3-benzothiadiazole-4,7-diyl)(4,4-dihexadecyl-4H-cyclopenta[2,1-b:3,4-b']dithiophene-2,6-diyl)] |

Exemplary Electron Transporting Materials:

| Abbreviated name | Full name |
|---|---|
| PC60BM, PC61BM, 60PCBM | [6,6]-Phenyl-C61-butyric acid methyl ester |
| PC70BM, PC71BM, 70PCBM | [6,6]-Phenyl-C61-butyric acid methyl ester |
| ZnO | Zinc oxide |
| TiO2 | Titanium oxide |
| FBR | (5Z,5'Z)-5,5'-{(9,9-dioctyl-9H-fluorene-2,7-diyl)bis[2,1,3-benzothiadiazole-7,4-diyl(Z)methylylidene]}bis(3-ethyl-2-thioxo-1,3-thiazolidin-4-one) |
| O-IDTBR | (5Z,5'Z)-5,5'-(7,7'-(4,4,9,9-tetraoctyl-4,9-dihydro-s-indaceno[1,2-b:5,6-b']dithiophene-2,7-diyl)bis(benzo[c][1,2,5]thiadiazole-7,4-diyl))bis(methanylylidene))bis(3-ethyl-2-thioxothiazolidin-4-one) |
| ITIC | 3,9-bis(2-methylene-(3-(1,1-dicyanomethylene)-indanone))-5,5,11,11-tetrakis(4-hexylphenyl)-dithieno[2,3-d:2',3'-d']-s-indaceno[1,2-b:5,6-b']dithiophene |
| ICBA, ICBA60 | 1',1'',4',4''-tetrahydro-di[1,4]methanonaphthaleno[5,6]fullerene-C60 |
| ICBA70 | 1',1'',4',4''-tetrahydro-di[1,4]methanonaphthaleno[5,6]fullerene-C70 |

-continued

| Abbreviated name | Full name |
|---|---|
| P(NDI2OD-T2), N2200, Polynaphtalene bithiophene | Poly{[N,N'-bis(2-octyldodecyl)naphthalene-1,4,5,8-bis(dicarboximide)-2,6-diyl]-alt-5,5'-(2,2'-bithiophene)} |
| PNDI-2F, P(NDI2OD-T2F), PNDI(2OD)2T-2F | Poly[[1,2,3,6,7,8-hexahydro-2,7-bis(2-octyldodecyl)-1,3,6,8-tetraoxobenzo[lmn][3,8]phenanthroline-4,9-diyl](3,3'-difluoro[2,2'-bithiophene]-5,5'-diyl)] |
| DPPDPyBT | Poly(2,5-bis(2-octyldodecyl)-3,6-di(pyridin-2-yl)-pyrrolo[3,4-c]pyrrole-1,4(2H,5H)-dione-alt-2,2'-bithiophene) |

Exemplary Radiation Attenuating Materials (i.e. as Nanoparticles):

| Abbreviated name | Full name |
|---|---|
| $Bi_2O_3$ | bismuth oxide |
| BiI3 | bismuth iodide |
| BiOCl | bismuth oxichloride |
| $TiO_2$ | titanium oxide |
| $Ta_2O_5$ | tantalum oxide |
| $WO_3$ | tungsten oxide |
| CdTe | cadmium telluride |
| HgTe | mercury telluride |
| | diamond |
| PbS | lead sulfide |
| PbSe | lead selenide |
| $ABX_3$ where A can be methylammonium, formamidinium, cesium, rubidium etc., B is lead, X can be iodine or bromine | Lead halide perovskites |

The following statements summarise some interesting aspects of at least some of the embodiments described herein.

A high atomic number nanoparticle is typically used (e.g. Z>45) that has the capability to stop ionizing radiation and generate free electrons and holes in a single ionizing radiation/nanoparticle interaction event.

A nanoparticle as defined for this invention typically follows the ASTM E2456-06 definition where one or two dimensions are within the 1-100 nm range. The minimum nanoparticle size is larger than twice the exciton Bohr radius below which the nanoparticles show quantization of energy levels (i.e. quantum dots) resulting in the display of indirect behaviour upon interaction with ionizing radiation (e.g. interaction of ionizing radiation results in the emission of light as opposed to the generation of free carriers that are extracted through the electron and hole transporting organic semiconductors).

The performance of the detector is typically dependent on the nanoparticle size. Due to the larger size of the nanoparticles as compared to the wavelength of the ionizing radiation, the latter undergoes scattering (e.g. Mie scattering) resulting in an increase in the path length. This scattering effect is increased as the particle size approaches the higher end of the limit set above. However, as the charge extraction generally takes place from a 10-15 nm depth from the nanoparticle size, a majority of the deposited X-ray energy is converted to heat. On the other hand, while the charge extraction is more efficient as the size approaches the lower limit of the dimensions mentioned above), the scattering effect is significantly reduced. Therefore a particle size in the range of 30-50 nm may be preferred (e.g. for X-ray radiation), although other dimensions are possible, as described above. The use of nanoparticles as defined here also enables broadband sensing of X-rays (e.g. detection of X-rays from 1 keV and above) due to the ionizing radiation scattering effects. Furthermore, the sensitivities of current direct X-ray detectors are limited to a very narrow energy range (e.g. amorphous selenium which is one of the most widely used direct X-ray detector materials is incapable of detecting X-rays with energies above 50 keV).

The radiation detectors described herein may use an ink consisting of at least two organic semiconductors, one which when processed into a solid state semiconductor preferentially transports positive charges (holes) and another which preferentially transports negative charges (electrons) to separate electrical contacts. In the field of organic photovoltaics as well as photodetectors (detecting UV to the near infrared portion of the electromagnetic spectrum), a mixture of organic semiconductors such as those indicated above is used. This mixture is often referred to as a bulk heterojunction (BHJ). The interaction of photons in the energy range of UV to the near infrared portion of the electromagnetic spectrum results in the formation of bound electrons and holes which are known as excitons. In organic photovoltaics and photodetectors, this BHJ architecture is required for breaking (or dissociation) of the exciton into free charge prior to being swept away through the electron and hole transporting organic semiconductors (often referred to as acceptor phase and donor phase, specifically in exciton based systems only). Although the mixture of organic semiconductors described herein do not partake in the exciton dissociation process in the direct radiation detector described here (as there is no exciton formation), the combination can still be referred to as a bulk heterojunction in view of the formation of a built-in electric field. Alternatively, the same bulk heterojunction may also be referred to as a p-n junction, an interpenetrating p-n junction, an interpenetrating network of percolated electron and hole transporting phases or a donor (referring to the hole transporting organic semiconductor)—acceptor (referring to the electron transporting organic semiconductor) system.

The number of organic semiconductors used can be increased provided that they do not impede the charge transport highlighted above. Furthermore, the organic semiconductors identified here can be polymers, small molecules, 0-dimensional, 1-dimensional, 2-dimensional or 3-dimensional structures.

The organic semiconductors indicated above may also be selected such that the combination of the organic semiconductors or the combination of the organic semiconductors and nanoparticles results in the formation of a built-in electric field which drives the free electrons and holes generated upon the interaction of incident X-rays with nanoparticles to separate electrical contacts resulting in an electrical signal (even in the absence of an external voltage bias). In other words, the use of the above combination of organic semiconductors enable a fully depleted diode even in the absence of an external electrical field.

Embodiments disclosed herein describe a detector consisting of a high atomic number (Z) nanoparticle that directly generates free electrons and holes upon interaction with ionizing radiation in a single step in combination with at least one material (e.g. an organic semiconductor) for transportation of holes and at least another material (e.g. an organic semiconductor) for the transportation of the electrons. The mixture of electron and hole transporting materials (such as organic semiconductors) used enables the extraction of X-ray generated free carriers (even in the absence of an external bias).

The nanoparticles used maybe of a single material type or maybe a mixture of nanoparticles consisting of different high Z materials. A single nanoparticle may also consist of two high Z materials provided that the materials are selected such that both the electron and hole extraction is not impeded and such that neither of the materials within a single nanoparticle display the properties of a quantum dot. The layering of one high Z material on another high Z material can be carried out in a manner such that even within the nanoparticle itself, a field acts to efficiently extract the charges directly generated upon interaction with ionizing radiation.

The preparation of the solid state detector may be carried out through the direct coating of the ink using techniques such as doctor blading, slot die coating, ink jet printing, gravure printing, spray coating, spin coating, drop casting etc. Furthermore, the solid state detector can be fabricated by the preparation of organic semiconductor powders which are obtained by adding an antisolvent to the ink resulting in the sedimentation of the organic semiconductor-nanoparticle mix followed by the removal of the solvents using roto-evaporation, drying in air or vacuum drying to obtain a powder. This powder can be pressed to any required size to form a solid state disk/pellet/slab/tile/wafer which in combination with appropriate electrical contacts for the selective extraction of electrons and holes at separate surfaces or at separate regions in the same surface or a combination of both enables the entirety to act as a direct ionizing radiation detector.

The use of blanket metal coatings to extract electrons and holes can result in the system behaving as a single detector element for coatings made using the solution or for solid bodies made using the powder. The ink may also be deposited onto either a CCD or CMOS backplane readout system followed by a single metal coating on the surface of the X-ray sensitive organic semiconductor:nanoparticle mixture or a patterned metal coating on an organic semiconductor:nanoparticle mixture enabling the fabrication of an X-ray imager. For the case of the powder, the powder can be pressed directly onto the CCD or a CMOS backplane followed by a single metal coating on the surface of the X-ray sensitive organic semiconductor:nanoparticle mixture or a patterned metal coating on an organic semiconductor:nanoparticle mixture enabling the fabrication of an X-ray imager. In both of the above cases, the backplane electronics can also be placed separately (i.e. not in the line of site with ionizing radiation) whilst patterned metal contacts on one of the detector surface can be electrically contacted with the individual sites on the readout electronics.

Interesting aspects of at least some embodiments described herein include:

The selection of high Z nanoparticles in the appropriate size regime that directly converts charges. It is noted that not all high Z materials will act as suitable systems for direct conversion of X-ray to charge as in the case of X-ray scintillators, which are high Z material where X-rays are converted to visible light.

The selection of nanoparticles whose nanoparticle size (i) enables Mie scattering (e.g. Mie scattering) of ionizing radiation, (ii) avoids indirect detection effects (due to the dimensions being in the quantum dot regime or due to the material behaving as a scintillator) (iii) enables efficient extraction of free protons and electrons generated.

The broadband response of the detector due to the scattering effects prevalent for all X-ray energies above 1 keV.

The use of at least two organic semiconductors where one semiconductor preferentially transports holes while the other transports electrons.

The use of the organic semiconductor system indicated above which results in a built-in-field within the device enabling the operation of the detector even n the absence of an external voltage bias.

If desired, the different functions discussed herein may be performed in a different order and/or concurrently with each other. Furthermore, if desired, one or more of the above-described functions may be optional or may be combined. Similarly, it will also be appreciated that the flow diagram of FIG. 4 is an example only and that various operations depicted therein may be omitted, reordered and/or combined.

It will be appreciated that the above described example embodiments are purely illustrative and are not limiting on the scope of the invention. Other variations and modifications will be apparent to persons skilled in the art upon reading the present specification.

Moreover, the disclosure of the present application should be understood to include any novel features or any novel combination of features either explicitly or implicitly disclosed herein or any generalization thereof and during the prosecution of the present application or of any application derived therefrom, new claims may be formulated to cover any such features and/or combination of such features.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes various examples, these descriptions should not be viewed in a limiting sense. Rather, there are several variations and modifications which may be made without departing from the scope of the present invention as defined in the appended claims.

The invention claimed is:

1. A device comprising:
a network comprising a first material for transporting positive electrical charges and a second material for transporting negative electrical charges, the first and second materials being dispersed within the network to form a plurality of electrical junctions; and
a plurality of nanoparticles dispersed within the network, wherein said nanoparticles each have at least one dimension larger than twice an exciton Bohr radius for said nanoparticles and at least one dimension less than 100 nm and wherein, in use, said nanoparticles directly convert incoming radiation into free positive and negative electrical charges for transportation by said first and second materials respectively.

2. The device as claimed in claim 1, wherein said nanoparticles attenuate the incoming radiation.

3. The device as claimed in claim 2, wherein said nanoparticles convert said radiation into positive and negative electrical charges in radiation-nanoparticle interaction events.

4. The device as claimed in claim 1, wherein said nanoparticles convert said radiation directly into positive and negative electrical charges in radiation-nanoparticle interaction events.

5. The device as claimed in claim 1, wherein said nanoparticles have at least one dimension between 20 nm and 100 nm.

6. The device as claimed in claim 1, wherein said nanoparticles have an atomic number of at least 45.

7. The device as claimed in claim 1, wherein said nanoparticles are formed from one or more metal oxides.

8. The device as claimed in claim 1, wherein the first and second materials are organic semiconductors.

9. The device as claimed in claim 1, wherein said network is a bulk heterojunction.

10. The device as claimed in claim 1, wherein said radiation comprises one or more of alpha particles, beta particles, neutrons, X-rays and gamma rays.

11. The device as claimed in claim 1, wherein dimensions and/or material of the nanoparticles are selected depending on a form of radiation intended to be detected by the device.

12. A radiation detector comprising:
    a first electrode;
    a second electrode; and
    the device as claimed in claim 1 sandwiched between the first and second electrodes.

13. The radiation detector as claimed in claim 12, further comprising a current measuring device.

14. The radiation detector as claimed in claim 12, further comprising a voltage source.

15. The radiation detector as claimed in claim 12, further comprising a wireless transmitter that enables real time data transmission to a remote computer.

16. The radiation detector as claimed in claim 12, further comprising a display for indicating radiation levels.

17. A system comprising a plurality of radiation detectors as claimed in claim 12.

18. The system as claimed in claim 17, wherein at least some of the plurality of radiation detectors are configured to:
    i) detect multiple different types of radiation;
    ii) detect one type of radiation; and/or
    iii) identify different energies of a particular radiation.

19. The system as claimed in claim 18, wherein the or each radiation detector is integrated either on a rigid backing or a flexible backing.

20. The radiation detector as claimed in claim 12, wherein the radiation detector is integrated either on a rigid backing or a flexible backing.

21. The device as claimed in claim 1, wherein said radiation comprises one or more of alpha particles, beta particles, neutrons, X-rays and gamma rays for radiation-nanoparticle interaction events, the dimensions and/or material of the nanoparticles are selected depending on a form of radiation intended to be detected by the device.

22. A radiation detector comprising:
    a first electrode;
    a second electrode; and
    the device as claimed in claim 21 sandwiched between the first and second electrodes.

23. A system comprising a plurality of the radiation detectors as claimed in claim 22, at least some of the plurality of radiation detector are configured to:
    i) detect multiple different types of radiation;
    ii) detect one type of radiation; and/or
    iii) identify different energies of a particular radiation,
    wherein the or each radiation detector is integrated either on a rigid backing or a flexible backing.

24. In a device including (a) a network comprising (i) a first material for transporting positive electrical charges and (ii) a second material for transporting negative electrical charges, wherein the first and second materials are dispersed within the network to form a plurality of electrical junctions, and (b) a plurality of nanoparticles dispersed within the network, wherein said nanoparticles each have at least one dimension larger than twice an exciton Bohr radius for said nanoparticles and at least one dimension less than 100 nm, a method of using said device comprises:
    the nanoparticles directly converting incoming radiation into free positive and negative electrical charges for transportation by said first and second materials respectively; and
recording a characteristic generated by the positive and negative electrical charges.

25. The method as claimed in claim 24, further comprising converting the incoming radiation into positive and negative electrical charges in radiation-nanoparticle interaction events.

26. The method as claimed in claim 24, wherein current is generated in response to the application of a voltage across the device.

27. The method as claimed in claim 24, further comprising converting the recorded characteristic into an estimate of a level of radiation.

28. A method comprising:
    dissolving semiconductors in one or more organic solvents to form a first material suitable for transporting positive electrical charges and a second material suitable for transporting negative electrical charges; and
    adding a plurality of nanoparticles to said dissolved semiconductors to form a matrix, wherein said nanoparticles each have at least one dimension larger than twice an exciton Bohr radius for said nanoparticles and at least one dimension less than 100 nm, and said nanoparticles are configured to directly convert incoming radiation into free positive and negative electrical charges for transportation by the first and second materials respectively.

29. The method as claimed in claim 28, further comprising applying the matrix to a substrate.

30. The method as claimed in claim 29, wherein applying the matrix to the substrate comprises one or more of doctor blading, slot die coating, ink jet printing, gravure printing, spray coating, spin coating, drop casting and 3D printing.

31. The method as claimed in claim 28, further comprising forming the matrix into one or more pellets or tiles.

32. In a radiation detector having a first electrode, a second electrode, and a device sandwiched between the first and second electrodes, wherein the device includes (a) a network comprising (i) a first material for transporting positive electrical charges and (ii) a second material for transporting negative electrical charges, wherein the first and second materials are dispersed within the network to form a plurality of electrical junctions, and (b) a plurality of nanoparticles dispersed within the network, wherein said nanoparticles each have at least one dimension larger than twice an exciton Bohr radius for said nanoparticles and at least one dimension less than 100 nm, a method of using said radiation detector comprises:

the nanoparticles directly converting incoming radiation into free positive and negative electrical charges for transportation by said first and second materials respectively; and recording a characteristic generated by the positive and negative electrical charges.

33. The method as claimed in claim 32 comprising integrating the radiation detector either on a rigid backing or a flexible backing.

34. The method of claim 32 further comprising using a plurality of the radiation detectors, wherein at least some of the plurality of radiation detectors are configured to: (i) detect multiple different types of radiation, (ii) detect one type of radiation, and/or (iii) identify different energies of a particular radiation.

35. The method as claimed in claim 34 comprising integrating the or each radiation detector either on a rigid backing or a flexible backing.

36. The method of claim 32, further comprising using a plurality of the radiation detectors, wherein said radiation comprises one or more of alpha particles, beta particles, neutrons, X-rays and gamma rays for radiation-nanoparticle interaction events, the dimensions and/or material of the nanoparticles are selected depending on a form of radiation intended to be detected by the device.

37. The method as claimed in claim 36 comprising integrating the or each radiation detector either on a rigid backing or a flexible backing.

38. The method of claim 32, further comprising using a plurality of the radiation detectors, and integrating the or each radiation detector either on a rigid backing or a flexible backing.

* * * * *